United States Patent

Chang et al.

[11] Patent Number: 5,837,592
[45] Date of Patent: *Nov. 17, 1998

[54] METHOD FOR STABILIZING POLYSILICON RESISTORS

[75] Inventors: Ming-Hsung Chang, Hsin-Chu; Chun-Wen Weng, Chia-I, both of Taiwan

[73] Assignee: Taiwan Semiconductor Manufacturing Company, Ltd., Hsin-Chin, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 568,712

[22] Filed: Dec. 7, 1995

[51] Int. Cl.$^6$ ................................................. H01L 21/20
[52] U.S. Cl. ..................... 438/382; 438/239; 438/385; 438/513; 438/798
[58] Field of Search ..................... 438/238, 330, 438/381, 382, 385, 474, 513, 795, 798

[56] References Cited

U.S. PATENT DOCUMENTS

| 4,912,065 | 3/1990 | Mizuno et al. | 438/301 |
| 5,013,678 | 5/1991 | Winnerl et al | 437/52 |
| 5,356,826 | 10/1994 | Natsume | 437/60 |
| 5,420,053 | 5/1995 | Miyazaki | 437/31 |
| 5,518,936 | 5/1996 | Yamamoto et al. | 437/24 |

FOREIGN PATENT DOCUMENTS

| 60752 | 4/1985 | Japan . | |
| 0292663 | 11/1988 | Japan | 437/918 |
| 0198524 | 8/1993 | Japan | 437/918 |

*Primary Examiner*—Tuan H. Nguyen
*Attorney, Agent, or Firm*—George O. Saile; Stephen B. Ackerman; Alex P. Szecsy

[57] ABSTRACT

A method for stabilizing a polysilicon resistor. Formed through a conventional method upon a semiconductor substrate is a polysilicon resistor. The polysilicon resistor is treated with a nitrogen plasma. After treatment with the nitrogen plasma, the polysilicon resistor exhibits a high and stable resistance having minimal susceptibility to variation due to intrusion of hydrogen or other reactive species into the polysilicon resistor.

23 Claims, 3 Drawing Sheets

METHOD FOR STABILIZING POLYSILICON RESISTORS

BACKGROUND OF THE INVENTION

1. Field of the Invention

The present invention relates generally to polysilicon resistors within integrated circuits. More particularly, the present invention relates to methods for stabilizing polysilicon resistors within integrated circuits.

2. Description of the Related Art

In addition to capacitors, transistors, diodes and other electrical circuit elements, integrated circuits typically also contain resistors within their fabrications. Resistors contained within integrated circuit fabrications typically provide an electrical load which assures proper operation of the integrated circuit into which those resistors are fabricated.

The traditional method for forming a resistor into an integrated circuit involves the doping of a discrete portion of the semiconductor substrate upon which the integrated circuit is formed, to provide a resistor of desired resistance. Due to limitations in semiconductor substrate surface area and limitations in parasitic capacitances, as well as the need for resistors of increasingly higher resistance, alternative methods have evolved for forming resistors within integrated circuits. In particular, it is now common in the art to form resistors within integrated circuits from discrete portions of polysilicon layers which are independently formed upon surfaces within those integrated circuits. Resistors formed through such discrete polysilicon layers within integrated circuits may be formed through a wide range of resistances and may be incorporated into various locations within an integrated circuit fabrication.

For example, Winnerl et al., in U.S. Pat. No. 5,013,678 discloses a method for forming a polysilicon load resistor upon a field oxide layer within an integrated circuit. The polysilicon load resistor is formed in part simultaneously with a polycide (ie: polysilicon/metal silicide stack) gate electrode within a Complementary Metal Oxide Semiconductor (CMOS) transistor or a polycide electrode connection within a bipolar transistor. Through the disclosed method there may be formed a polysilicon load resistor with a higher resistance than the polycide gate electrode or polycide electrode connection.

Analogously, Natsume, in U.S. Pat. No. 5,356,826 describes a method for simultaneously forming in part polysilicon resistor, polysilicon capacitor and polysilicon gate electrode elements within integrated circuits.

An unfortunate consequence of forming resistors from discrete polysilicon layers within integrated circuits is the variability in resistance inherent in the discrete polysilicon layers from which are formed those polysilicon resistors. The variability in resistance derives from selective quenching of the residual chemical reactivity of the polysilicon material from which is formed the polysilicon resistors. In particular, the residual chemical reactivity is often easily quenched through reaction with mobile hydrogen that is evolved in various integrated circuit fabrication processes prior to or subsequent to the polysilicon layer formation processes. Typically, substantial quantities of mobile hydrogen are evolved in thin film deposition processes employing silane as a starting material. Such processes include but are not limited to silicon oxide deposition processes and silicon nitride deposition processes.

A method for stabilizing polysilicon resistors from resistance variations is disclosed by Miyazaki in U.S. Pat. No. 5,420,053. Miyazaki discloses a method whereby a polysilicon layer in contact with a silicon nitride layer is annealed in order to stabilize the resistance of the polysilicon layer by reaction with hydrogen emitted from the silicon nitride layer. The polysilicon layer is subsequently patterned to form a polysilicon resistor.

While the method as disclosed by Miyazaki presumably stabilizes a polysilicon resistor formed within an integrated circuit, the polysilicon resistor will typically be stabilized at a lower resistance than optimally achievable with polysilicon resistors. Thus, when it is desirable to provide a stabilized polysilicon resistor of high resistance, alternative methods are typically employed to stabilize the polysilicon resistor. Common among such alternative methods is the practice of shielding polysilicon resistors from intrusion of hydrogen or other reactive species by forming metal plates surrounding the polysilicon resistor. Although there are circumstances when such methods are successful, such shielding methods may suffer from: (1) the inability to fully exclude mobile hydrogen, and/or (2) an inability to optimally form metal plates due to metal layer layout limitations.

Thus, it is desirable in the art to provide additional methods for stabilizing polysilicon resistors at high resistances within integrated circuits. Particularly desirable are methods which provide stable high resistance polysilicon resistors without the need for completely excluding hydrogen through devices such as metal plates.

SUMMARY OF THE INVENTION

A first object of the present invention is to provide a method for stabilizing a polysilicon resistor at high resistance within an integrated circuit without the need for completely excluding hydrogen through devices such as metal plates.

A second object of the present invention is to provide a method in accord with the first object of the present invention, which method is also manufacturable.

In accord with the objects of the present invention, there is provided a method for stabilizing within integrated circuits polysilicon resistors at high resistances. To stabilize a polysilicon resistor through the method of the present invention, there is first provided a semiconductor substrate which has formed upon its surface a polysilicon resistor. The polysilicon resistor is then treated with a nitrogen plasma.

The method of the present invention provides a polysilicon resistor stabilized at a high resistance. Although the mechanism by which the method of the present invention stabilizes a polysilicon resistor at a high resistance through treatment with a nitrogen plasma is not entirely well understood, it is nonetheless clear that a polysilicon resistor, when treated with a nitrogen plasma through the method of the present invention, will possess a stable and high resistance.

The method of the present invention is manufacturable. The method of the present invention provides that an otherwise conventional polysilicon resistor may be stabilized at a high resistance through treating the polysilicon resistor with a nitrogen plasma. Methods and materials through which nitrogen plasmas may be formed and integrated circuit surfaces exposed to those nitrogen plasmas are known in the art. Such processes are readily manufacturable.

BRIEF DESCRIPTION OF THE DRAWINGS

The objects, features and advantages of the present invention are understood within the context of the description set forth below. The description is understood in conjunction with the accompanying drawings, which form a material part of this disclosure, wherein.

DESCRIPTION OF THE PREFERRED EMBODIMENTS

The present invention provides a method for stabilizing polysilicon resistors at high resistance within integrated circuits. The method of the present invention provides that a high resistance polysilicon resistor is formed within an integrated circuit through conventional methods. The high resistance polysilicon resistor is then stabilized through treatment with a nitrogen plasma. Although the mechanism by which the nitrogen plasma treatment stabilizes the polysilicon resistor at a high resistance is not entirely well understood, it is nonetheless clear that the nitrogen plasma treatment of the present invention provides a stabilized high resistance polysilicon resistor.

The method of the present invention may be employed in stabilizing polysilicon resistors within various types of integrated circuits. The method of the present invention may be employed in stabilizing polysilicon resistors within integrated circuits including but not limited to Dynamic Random Access Memory (DRAM) integrated circuits, Static Random Access Memory (SRAM) integrated circuits, Application Specific Integrated Circuits (ASICs), integrated circuits having within their fabrications Field Effect Transistors (FETs), integrated circuits having within their fabrications bipolar transistors and integrated circuits having within their fabrications Bipolar Complementary Metal Oxide Semiconductor (BiCMOS) transistors. The method of the present invention has broad applicability in stabilizing polysilicon resistors within various types of integrated circuits.

Figure 1:
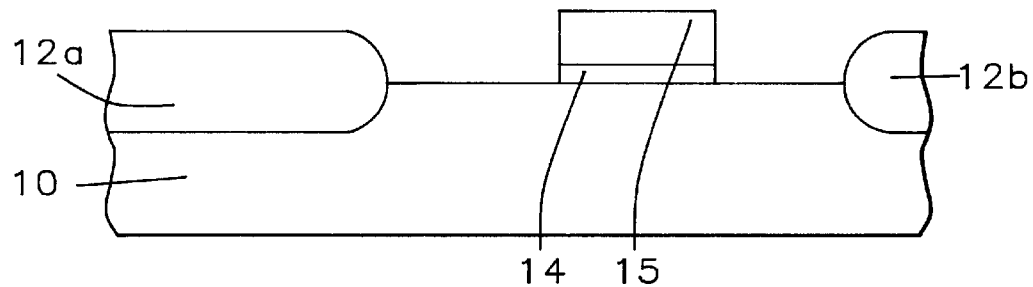
FIG. 1 to FIG. 4 show a series of schematic cross-sectional diagrams illustrating progressive stages in forming the polysilicon resistor of the present invention into an integrated circuit which represents the preferred embodiment of the present invention.

Referring now to FIG. 1 to FIG. 4, there is shown a series of cross-sectional schematic diagrams illustrating progressive stages in forming the stabilized high resistance polysilicon resistor of the present invention into an integrated circuit which represents the preferred embodiment of the present invention. Shown in FIG. 1 is a cross-sectional schematic diagram of the integrated circuit at the early stages of its formation.

Shown in FIG. 1 is a semiconductor substrate 10 upon and within whose surface there are formed isolation regions 12a and 12b. Semiconductor substrates upon which the present invention may be practiced may be formed with either dopant polarity, any dopant concentration and any crystallographic orientation. Typically, the semiconductor substrate 10 upon which is practiced the present invention is a N- or P- silicon semiconductor substrate having a (100) crystallographic orientation.

Methods by which isolation regions may be formed within and upon semiconductor substrates are known in the art. Such methods include but are not limited to methods whereby a portion of a semiconductor substrate exposed through an appropriate mask is oxidized to form isolation regions within and upon the semiconductor substrate, and methods whereby a separate insulating layer is formed upon a semiconductor substrate surface and subsequently patterned to form isolation regions upon the semiconductor substrate. For the preferred embodiment of the present invention, the isolation regions 12a and 12b are preferably formed through a thermal oxidation process at a temperature of about 950 to about 1010 degrees centigrade whereby portions of the semiconductor substrate 10 exposed through an oxidation mask are consumed to form within and upon the semiconductor substrate 10 isolation regions 12a and 12b of silicon oxide. Preferably, the isolation regions 12a and 12b of silicon oxide are from about 4600 to about 5400 angstroms thick.

Also illustrated within FIG. 1 is a gate oxide layer 14 upon which resides a gate electrode 15. Both the gate oxide layer 14 and the gate electrode 15 reside upon the active semiconductor region of the semiconductor substrate 10. Both the gate oxide layer 14 and the gate electrode 15 are components of a Field Effect Transistor (FET).

Methods and materials through which gate oxide layers and gate electrodes may be formed upon active semiconductor regions of semiconductor substrates are known in the art. Gate oxide layers may be formed through methods including but not limited to methods whereby the surface of the active semiconductor region of a semiconductor substrate is oxidized to form a blanket gate oxide layer upon the active semiconductor region, and methods whereby a blanket gate oxide layer is independently deposited upon the surface of the active semiconductor region. Excess portions of blanket gate oxide layers formed upon active semiconductor regions may then be removed to form gate oxide layers through etching methods conventional to the art.

Gate electrodes are typically formed via patterning and etching through methods as are conventional in the art of blanket layers of gate electrode materials which are formed upon the surfaces of blanket gate oxide layers. Typically, blanket layers of gate electrode materials are formed from highly conductive materials such as metals, metal alloys, highly doped polysilicon and polycides (polysilicon/metal silicide stacks).

For the preferred embodiment of the present invention, the gate oxide layer 14 is preferably formed through patterning of a blanket gate oxide layer formed through thermal oxidation of the active semiconductor region of semiconductor substrate 10 at a temperature of about 800 to about 900 degrees centigrade to yield a typical blanket gate oxide layer thickness of about 100 to about 130 angstroms. For the preferred embodiment of the present invention, the gate electrode 15 is preferably formed by patterning and etching a blanket polycide layer formed upon the blanket gate oxide layer. The blanket polycide layer is preferably formed of a thermally doped blanket polysilicon layer of thickness about 1350 to about 1650 angstroms, upon which thermally doped blanket polysilicon layer is formed a blanket tungsten silicide layer of thickness about 1150 to about 1350 angstroms. Once the blanket polycide layer has been patterned to yield the gate electrode 15, the gate electrode 15 may be used as an etch mask to pattern the gate oxide layer 14 from the blanket gate oxide layer.

Figure 2:
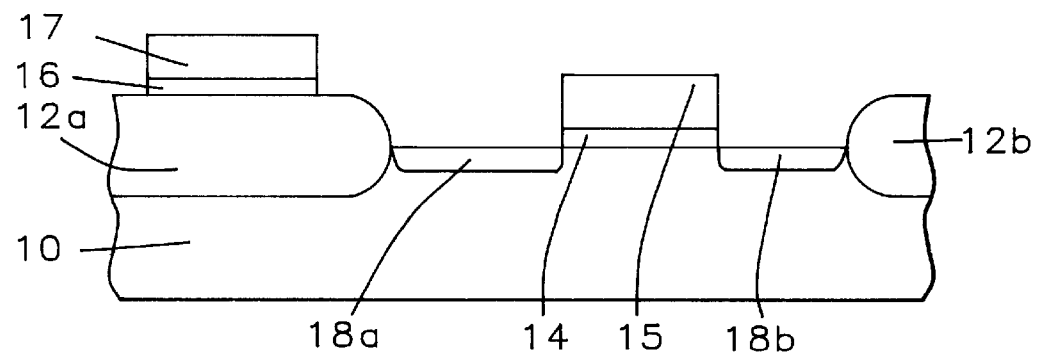

Referring now to FIG. 2 there is shown a schematic cross-sectional diagram illustrating the results of further processing of the integrated circuit whose structure is illustrated in FIG. 1. Shown in FIG. 2 is the presence of a patterned pre-polysilicon dielectric layer 16 upon which resides a polysilicon resistor 17. Analogously to the gate oxide layer 14 and the gate electrode 15, the patterned pre-polysilicon dielectric layer 16 and the polysilicon resistor 17 are also preferably formed through patterning through photolithographic and etching methods as are known in the art of corresponding blanket layers. The patterned pre-polysilicon dielectric layer 16 is preferably patterned from a blanket pre-polysilicon dielectric layer, and the polysilicon resistor 17 is preferably patterned from a blanket polysilicon layer.

Although several methods and materials may in general be employed in forming blanket pre-polysilicon dielectric layers within integrated circuits, the blanket pre-polysilicon dielectric layer from which is formed the patterned pre-polysilicon dielectric layer 16 is preferably formed of a silicon oxide layer deposited upon the integrated circuit whose structure is illustrated in FIG. 1 through a Chemical Vapor Deposition (CVD) method. Analogously, the blanket polysilicon layer from which is patterned the polysilicon resistor 17 may also be formed through several methods as are known in the art, including but not limited to Chemical Vapor Deposition (CVD) methods employing silane as a silicon source material, Chemical Vapor Deposition (CVD) methods employing dichlorosilane as a silicon source material and Physical Vapor Deposition (PVD) methods employing a silicon target.

Preferably, the blanket pre-polysilicon dielectric layer and the patterned pre-polysilicon dielectric layer 16 are from about 350 to about 450 angstroms thick. Preferably, the blanket polysilicon layer and the polysilicon resistor 17 are from about 2400 to about 3000 angstroms thick. In addition to the preceding thicknesses, the patterned pre-polysilicon dielectric layer 16 and the polysilicon resistor 17 will also typically have a projected area upon the isolation region 12a of the semiconductor substrate 10 of about 2 to about 6 microns in width and about 5 to about 300 microns in length.

Typically, it will be desirable to provide different levels of resistance to the polysilicon resistor 17. Thus, different levels and different types of dopants may be incorporated into the polysilicon resistor 17, through methods as are conventional in the art, including but not limited to ion implantation methods and thermal diffusion methods. Typically, although not exclusively, it will be preferred that the polysilicon resistor 17 has a higher resistance than the gate electrode 15. Typically, it will be desired that the dopants are incorporated into the polysilicon resistor 17 through ion implantation at an ion implantation dose of from about 1E13 to about 1E15 dopant atoms per square centimeter and an ion implantation energy of from about 60 to about 80 keV.

Finally, there is shown in FIG. 2 the presence of low dose ion implants 18a and 18b formed within the surface of the active semiconductor region of the semiconductor substrate 10 at areas not occupied by the gate electrode 15, the gate oxide layer 14 and the isolation regions 12a and 12b. The low dose ion implants 18a and 18b are components of Lightly Doped Drain (LDD) ion implant structures. The Lightly Doped Drain (LDD) ion implant structures provide electric field gradients between the semiconductor substrate 10 and the gate electrode 15 edges, thus limiting injection of charge carriers into the gate oxide layer 14. Methods and materials through which low dose ion implants may be formed within semiconductor substrates are known in the art. Such methods typically employ dopant species which are ionized and implanted into a semiconductor substrate at sufficient velocity and dose to form into the semiconductor substrate a region of conductivity sufficient for a low dose ion implant. The polarity desired for the low dose ion implant will dictate the polarity of the dopant species. Arsenic dopant species, boron dopant species and phosphorus dopant species are common in the art. For the preferred embodiment of the present invention, the low dose ion implants 18a and 18b are preferably formed through implanting a suitable dopant species into the active region of the semiconductor substrate 10 at about 1E13 to about 5E13 ions per square centimeter dose and about 40 to about 70 keV ion implantation energy.

Figure 3:
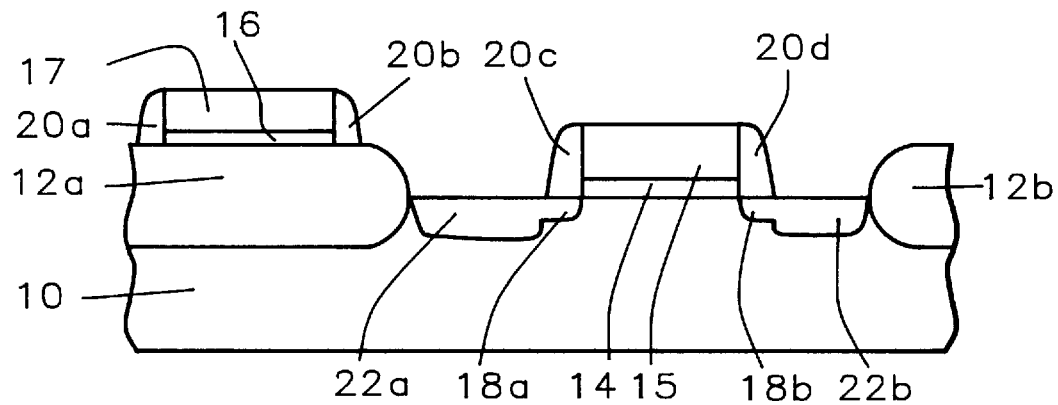

Referring now to FIG. 3 there is shown a schematic cross-sectional diagram illustrating the results of further processing of the integrated circuit illustrated in FIG. 2. Shown in FIG. 3 is the presence of insulator spacers 20a and 20b adjoining a pair of opposite edges of the patterned pre-polysilicon dielectric layer 16 and the polysilicon resistor 17, and the presence of insulator spacers 20c and 20d adjoining a pair of opposite edges of the gate oxide layer 14 and the gate electrode 15. Methods and materials through which insulator spacers may be formed within integrated circuits are known in the art. Insulator spacers are typically formed through anisotropic etching of a blanket layer of insulator spacer material formed upon the surface of a semiconductor substrate. The blanket layer of insulator spacer material may be formed from materials including but not limited to silicon oxide materials, silicon nitride materials and silicon oxynitride materials. The anisotropic etching is typically accomplished through a Reactive Ion Etch (RIE) anisotropic etch employing an etchant gas mixture appropriate to the insulator spacer material. For the preferred embodiment of the present invention, the insulator spacers 20a, 20b, 20c and 20d may be formed of silicon oxide materials, silicon nitride materials and silicon oxynitride materials, as are common in the art.

Also shown in FIG. 3 is the presence of source/drain electrodes 22a and 22b which form, in conjunction with the respective low dose ion implants 18a and 18b, the Lightly Doped Drain (LDD) electrode structure of the Field Effect Transistor (FET) illustrated in FIG. 3. Methods and materials through which source/drain electrodes may be formed within integrated circuits are known in the art. Such methods typically employ dopant species which are ionized and implanted into a semiconductor substrate at sufficient velocity and dose to form into the semiconductor substrate a region of conductivity sufficient for a source/drain electrode. The polarity of dopant employed in forming a source/drain electrode will be dictated by the polarity of the dopant employed in forming a low dose ion implant, if a low dose ion implant is present. Analogously with low dose ion implants, arsenic dopant species, boron dopant species and phosphorus dopant species are common in the art of forming source/drain electrodes through ion implant processes. For the preferred embodiment of the present invention, the source/drain electrodes 22a and 22b are preferably formed through implanting a suitable dopant species into the active region of the semiconductor substrate 10 at about 1E15 to about 5E15 ions per square centimeter dose and about 40 to about 70 keV ion implantation energy.

Figure 4:
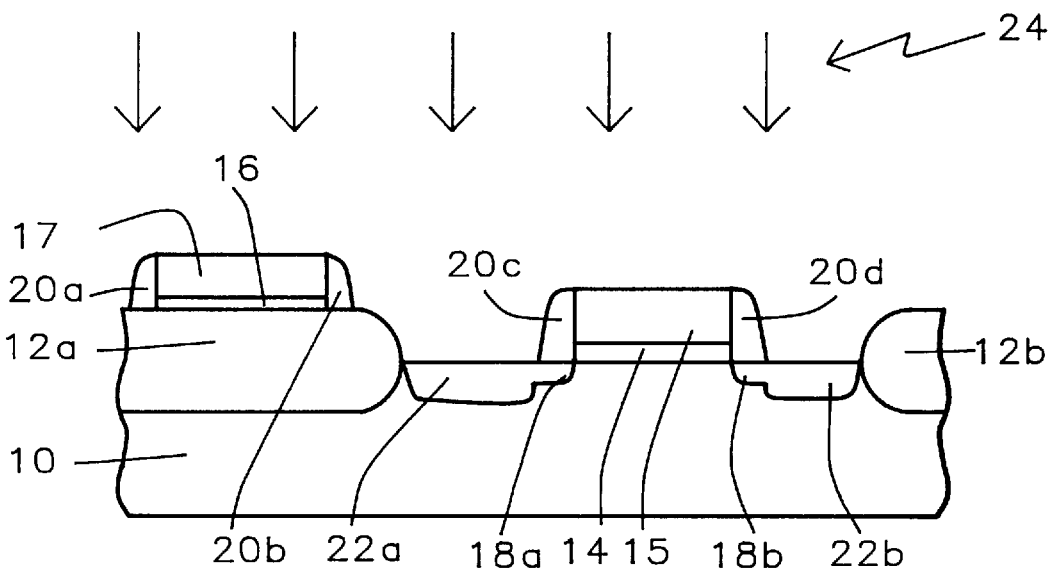

Referring now to FIG. 4 there is shown a schematic cross-sectional diagram illustrating the results of further processing of the integrated circuit whose structure is illustrated in FIG. 3. Shown in FIG. 4 is the presence of a nitrogen plasma 24 through which is treated the surface of the semiconductor substrate 10, and in particular the polysilicon resistor 17. Although various portions of the semiconductor substrate 10 may be masked when exposing the polysilicon resistor 17 to the nitrogen plasma 24, in practice of the preferred embodiment of the present invention no masking will typically be needed.

Methods and materials through which nitrogen plasmas may be formed for treatment of semiconductor substrate surfaces are known in the art. Such plasmas are typically formed in plasma reactor chambers under conditions of controlled nitrogen flow, controlled reactor chamber pressure, controlled semiconductor substrate temperature and controlled radio frequency power. For the preferred embodiment of the present invention, the nitrogen plasma 24 treatment of the polysilicon resistor 17 is preferably undertaken at a nitrogen flow rate of about 480 to about 520 standard cubic centimeters per minute (sccm), a reactor chamber pressure of from about 1.4 to about 1.6 torr, a semiconductor substrate temperature of from about 375 to about 425 degrees centigrade and a split radio frequency power including a first radio frequency power of from about 425 to about 475 watts at 350 kHz and a second radio frequency power of about 40 to about 60 watts at 13.56 MHz. The semiconductor substrate 10 as illustrated in FIG. 4 is preferably exposed to the nitrogen plasma 24 formed under the preceding conditions for a time period of from about 60 to about 300 seconds.

Upon treating the polysilicon silicon resistor 17 with the nitrogen plasma 24 there is formed the stabilized polysilicon resistor of the present invention within the integrated circuit of the preferred embodiment of the present invention. The stabilized polysilicon resistor of the present invention may be formed with a high and stable resistance without the need for completely excluding hydrogen through devices such as metal plates within the integrated circuit within which is formed the stabilized polysilicon resistor.

EXAMPLES 1–12

Figure 5:
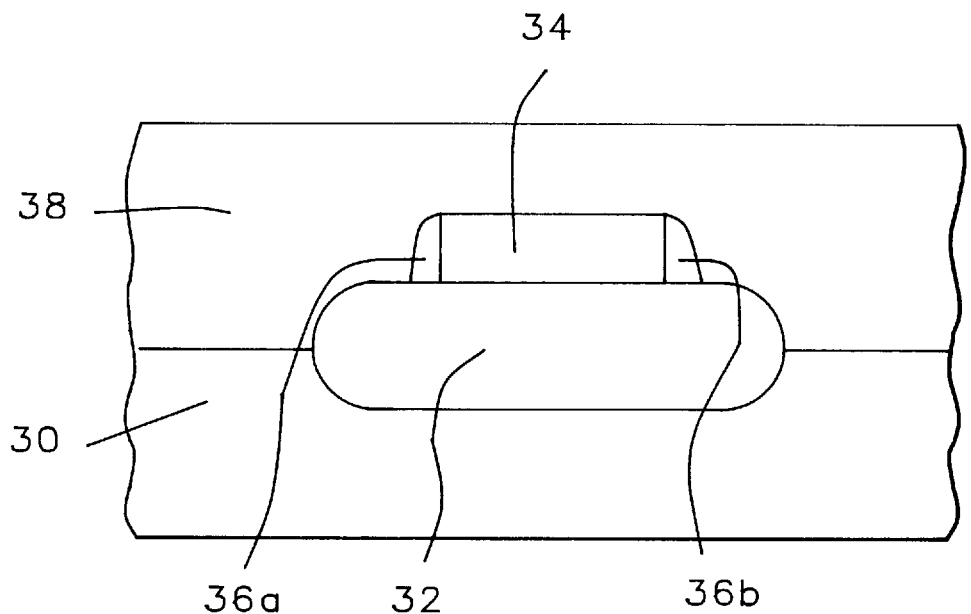
FIG. 5 and FIG. 6 show a pair of schematic cross-sectional diagrams illustrating polysilicon resistor test structures into which are formed polysilicon resistors described in the EXAMPLES of the present invention.

A first series of six polysilicon resistors was formed in accord with the test structure whose schematic cross-sectional diagram is illustrated in FIG. 5. Shown in FIG. 5 is a semiconductor substrate 30 within and upon whose surface was formed an oxide isolation region 32 of thickness about 5000 angstroms. Formed upon the oxide isolation region 32 was a polysilicon resistor 34 of thickness about 2700 angstroms. For three of the six polysilicon resistors 34 within the first series of six polysilicon resistors, the surface dimensions of the polysilicon resistors 34 were 5 microns in width and 300 microns in length upon the oxide isolation region 32. For the remaining three polysilicon resistors 34 within the first series of six polysilicon resistors, the surface dimensions of the polysilicon resistors 34 were 5 microns in width and 10 microns in length upon the oxide isolation region 32. Thus, there were formed two sets of three polysilicon resistors, the two sets differing in length of the polysilicon resistors 34. The two sets of three polysilicon resistors were then divided into three groups of two polysilicon resistors, each group having one polysilicon resistor 300 microns in length and one polysilicon resistor 10 microns in length.

All of the polysilicon resistors 34 within the first group of six polysilicon resistors were formed through a Chemical Vapor Deposition (CVD) process employing silane as the silicon source material. All of the polysilicon resistors 34 within the first group of six polysilicon resistors were doped with phosphorus atoms through an ion implantation method employing an ion implantation dose of about 9.0E14 phosphorus ions per square centimeter and an ion implantation energy of about 80 kev. Formed then at the edges of the polysilicon resistors 34 were insulator spacers 36a and 36b of a silicon oxide formed through a method as disclosed in the preferred embodiment of the present invention.

Each group of two polysilicon resistors within the three groups of two polysilicon resistors then received a nitrogen plasma treatment for one of three different time periods. The time periods were zero minutes, 2 minutes and 5 minutes. The nitrogen plasma treatments were undertaken at a nitrogen flow rate of about 500 standard cubic centimeters per minute (sccm), a reactor chamber pressure of about 1.5 torr, a semiconductor substrate temperature of about 400 degrees centigrade and a split radio frequency power including a first radio frequency power of about 450 watts at 350 kHz and a simultaneous second radio frequency power of about 50 watts at 13.56 MHz. Finally, there was then formed upon the surfaces of each of the polysilicon resistors 34 within the first group of six polysilicon resistors a dielectric layer 38. The dielectric layer 38 was formed of a boron and phosphorus doped silicon oxide deposited through a Chemical Vapor Deposition (CVD) method employing Tetra Ethyl Ortho Silicate (TEOS) as the silicon source material. The thickness of the dielectric layer 38 was about 11000 angstroms.

The integrated circuits upon which were formed the first series of six polysilicon resistors were then fabricated to completion using methods and materials as are conventional in the art. The resistances of the six polysilicon resistors were then measured using methods as are conventional to the art.

Figure 6:
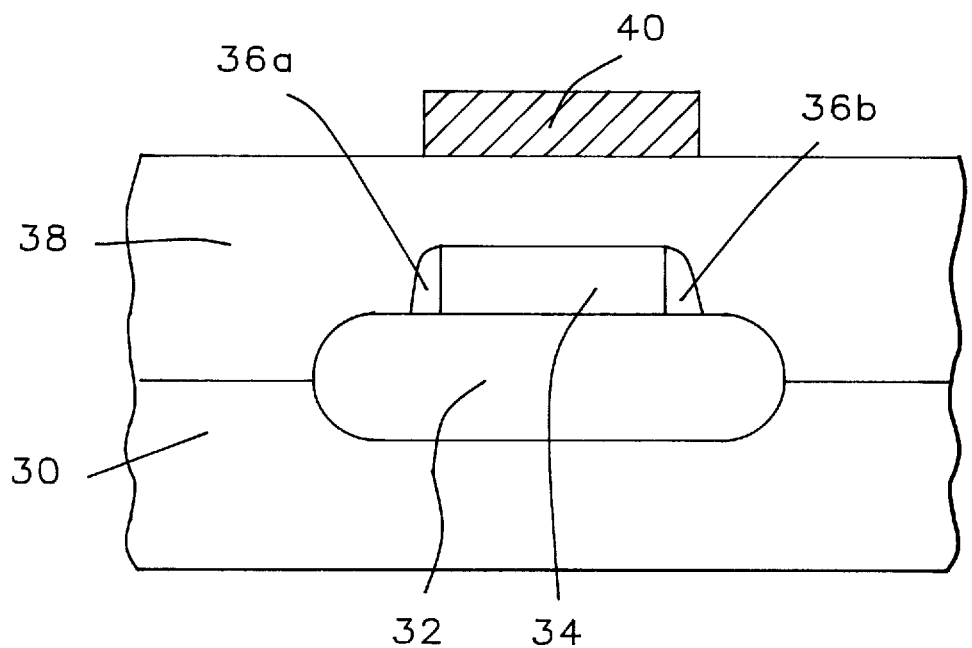

A second series of six polysilicon resistors was prepared in accord with the parameters outlined for the first series of six polysilicon resistors. However, the second series of six polysilicon resistors was prepared in accord with the schematic cross-sectional diagram illustrated in FIG. 6, where all structures, thicknesses and methods are equivalent to the structures, thicknesses and methods outlined for the first series of six polysilicon resistors whose structure is illustrated by reference to FIG. 5, with one single exception.

The single exception for the second series of six polysilicon resistors is the presence of a metal plate 40 upon the surface of the dielectric layer 38, the metal plate 40 being centered above the polysilicon resistor 34. The metal plate 40 was patterned from an aluminum alloy conductor layer above and below which resided titanium nitride barrier layers, as is common in the art. The thickness of the metal plate 40 was about 4000 angstroms, although such metal plates are typically in the range of 3600 to 4400 angstroms. The surface area of the metal plate 40 was about 15 microns in width and about 310 microns in length above the polysilicon resistor 34 which was about 5 microns in width and about 300 microns in length. The surface area of the metal plate 40 was about 15 microns in width and about 20 microns in length above the polysilicon resistor 34 which was about 5 microns in width and about 10 microns in length.

Analogously with the first series of six polysilicon resistors, the integrated circuits into which were formed the second series of six polysilicon resistors were also fabricated to completion in a fashion otherwise equivalent to the integrated circuits into which the first series of six polysilicon resistors were formed. The resistances of the second series of six polysilicon resistors were then also measured through methods as are conventional to the art. The calculated values of sheet resistances, Rs, for the first series of six polysilicon resistors and the second series of six polysilicon resistors are presented in TABLE I, along with the calculated sheet resistance differences of the polysilicon resistors in the presence and absence of a metal plate.

TABLE I

| N2 Plasma (min) | Resistor W/L (mic/mic) | Rs with plate (ohm/sq) | Rs no plate (ohm/sq) | Rs diff (ohm/sq) |
|---|---|---|---|---|
| 0 | 5/300 | 2057 | 1898 | 159 |
| 2 | 5/300 | 1924 | 1777 | 147 |
| 5 | 5/300 | 1986 | 1860 | 126 |
| 0 | 5/10 | 2063 | 1979 | 84 |
| 2 | 5/10 | 1943 | 1867 | 76 |
| 5 | 5/10 | 1997 | 1937 | 60 |

As is seen from review of the data of TABLE I, the difference in sheet resistance between polysilicon resistors having a metal plate formed thereover and polysilicon resistors having no metal plate formed thereover decreases as the polysilicon resistors are exposed to a nitrogen plasma treatment for increasing time periods. On the basis of this observation, it is concluded that the nitrogen plasma treatment of the polysilicon resistors of the EXAMPLES provides polysilicon resistors of stabilized and high resistance without the need for completely excluding hydrogen through devices such as metal plates.

As is understood by a person skilled in the art, the stabilized high resistance polysilicon resistors within the preferred embodiment of the present invention and stabilized high resistance polysilicon resistors of the EXAMPLES of the present invention are illustrative of the present invention rather than limiting of the present invention. Revisions may be made to methods, materials, structures and dimensions through which are formed the stabilized high resistance polysilicon resistors within the preferred embodiment and EXAMPLES of the present invention while still forming a stabilized high resistance polysilicon resistor within the spirit and scope of the present invention.

What is claimed is:

1. A method for forming a polysilicon resistor comprising:
   providing a semiconductor substrate having a polysilicon resistor formed thereupon;
   treating the polysilicon resistor with a nitrogen plasma to form a nitrogen plasma treated polysilicon resistor; and
   forming over the nitrogen plasma treated polysilicon resistor a dielectric layer.

2. The method of claim 1 wherein the polysilicon resistor has a thickness of from about 2400 to about 3000 angstroms and a projected area upon the semiconductor substrate of about 2 to about 6 angstroms in width and about 5 to about 300 angstroms in length.

3. The method of claim 1 wherein the polysilicon resistor is formed through a Chemical Vapor Deposition (CVD) method employing silane as a silicon source material.

4. The method of claim 1 wherein the polysilicon resistor is formed through a Chemical Vapor Deposition (CVD) method employing dichlorosilane as a silicon source material.

5. The method of claim 1 wherein the polysilicon resistor is formed through a Physical Vapor Deposition (PVD) sputtering method employing a silicon target.

6. The method of claim 1 wherein the polysilicon resistor is doped through incorporation of a dopant into the polysilicon resistor through ion implantation at an ion implantation dose of from about 1E13 to about 1E15 dopant atoms per square centimeter and an ion implantation energy of from about 60 to about 80 keV.

7. The method of claim 1 wherein the polysilicon resistor is treated with the nitrogen plasma for an exposure time of from about 60 to about 300 seconds.

8. The method of claim 1 wherein the nitrogen plasma has a nitrogen flow rate of about 480 to about 520 standard cubic centimeters per minute, a reactor chamber pressure of about 1.4 to about 1.6 torr, a semiconductor substrate temperature of from about 375 to about 425 degrees centigrade and a split radio frequency power including a first radio frequency power of about 425 to about 475 watts at 350 kHz and a simultaneous second radio frequency power of about 40 to about 60 watts at 13.56 MHz.

9. The method of claim 1 further comprising forming an insulator layer beneath the polysilicon resistor.

10. The method of claim 9 wherein the insulator layer is a silicon oxide insulator layer.

11. The method of claim 1 further comprising forming a metal plate above the polysilicon resistor.

12. The method of claim 1 wherein the metal plate is formed from a conductor layer within an integrated circuit at a thickness of from about 3600 to about 4400 angstroms.

13. The method of claim 1 wherein nitrogen plasma treatment of the polysilicon resistor stabilizes a resistance of the nitrogen plasma treated polysilicon resistor against decrease when the dielectric layer is formed over the nitrogen plasma treated polysilicon resistor.

14. A method for forming a polysilicon resistor within an integrated circuit comprising:
   providing a semiconductor substrate having a minimum of one transistor formed therein and thereupon;
   forming a polysilicon resistor upon the semiconductor substrate;
   treating the polysilicon resistor with a nitrogen plasma to form a nitrogen plasma treated polysilicon resistor; and
   forming over the nitrogen plasma treated polysilicon resistor a dielectric layer.

15. The method of claim 14 wherein the polysilicon resistor has a thickness of from about 2400 to about 3000 angstroms and a projected area upon the semiconductor substrate of about 2 to about 6 microns in width and about 5 to about 300 angstroms in length.

16. The method of claim 14 wherein the polysilicon resistor is formed through a method chosen from the group of methods consisting of a Chemical Vapor Deposition (CVD) method employing silane as a silicon source material, a Chemical Vapor Deposition (CVD) method employing dichlorosilane as a silicon source material, and a Physical Vapor Deposition (PVD) sputtering method employing a silicon target.

17. The method of claim 14 wherein the polysilicon resistor is doped through incorporation of a dopant into the polysilicon resistor through ion implantation at an ion implantation dose of from about 1E13 to about 1E15 dopant atoms per square centimeter and an ion implantation energy of from about 60 to about 80 keV.

18. The method of claim 14 wherein the polysilicon resistor is treated with the nitrogen plasma for an exposure time of from about 60 to about 300 seconds.

19. The method of claim 14 wherein the nitrogen plasma has a nitrogen flow rate of about 480 to about 520 standard cubic centimeters per minute, a reactor chamber pressure of about 1.4 to about 1.6 torr, a semiconductor substrate temperature of about 375 to about 425 degrees centigrade and a split radio frequency power including a first radio frequency power of from about 425 to about 475 watts at 350 kHz and a simultaneous second radio frequency power of from about 40 to about 60 watts at 13.56 MHz.

20. The method of claim 14 further comprising forming an insulator layer beneath the polysilicon resistor.

21. The method of claim 14 further comprising forming a metal plate above the polysilicon resistor.

22. The method of claim 21 wherein the metal plate is formed from a conductor layer within an integrated circuit at a thickness of from about 3600 to about 4400 angstroms.

23. The method of claim 14 wherein the nitrogen plasma treatment of the polysilicon resistor stabilizes a resistance of the nitrogen plasma treated polysilicon resistor when the dielectric layer is formed over the nitrogen plasma treated polysilicon resistor.

* * * * *